(12) United States Patent
Chen et al.

(10) Patent No.: US 7,286,329 B1
(45) Date of Patent: Oct. 23, 2007

(54) GMR SENSOR WITH SHALLOW CONTIGUOUS JUNCTION AND BIAS LAYERS ALIGNED WITH FREE SENSOR LAYERS

(75) Inventors: Yingjian Chen, Fremont, CA (US); Wei Zhang, Fremont, CA (US); Mohamad T. Krounbi, San Jose, CA (US); Satoru Araki, San Jose, CA (US); Jinqiu Zhang, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 425 days.

(21) Appl. No.: 10/788,656

(22) Filed: Feb. 27, 2004

Related U.S. Application Data

(60) Provisional application No. 60/459,715, filed on Apr. 2, 2003.

(51) Int. Cl.
*G11B 5/39* (2006.01)
(52) U.S. Cl. .................................. 360/324.12
(58) Field of Classification Search .......... 360/324.12, 360/324.11
See application file for complete search history.

(56) References Cited

U.S. PATENT DOCUMENTS

| | | | |
|---|---|---|---|
| 6,636,395 B1 * | 10/2003 | Terunuma | 360/324.11 |
| 6,668,443 B2 * | 12/2003 | Chien et al. | 29/603.18 |
| 6,714,388 B2 * | 3/2004 | Hasegawa et al. | 360/324.11 |
| 6,731,479 B2 * | 5/2004 | Ooshima et al. | 360/324.12 |
| 6,760,200 B2 * | 7/2004 | Hasegawa | 360/324.12 |
| 2003/0011947 A1 * | 1/2003 | Saito et al. | 360/324.11 |
| 2003/0030947 A1 * | 2/2003 | Ooshima | 360/324.12 |

\* cited by examiner

*Primary Examiner*—Julie Anne Watko

(74) *Attorney, Agent, or Firm*—Strategic Patent Group

(57) ABSTRACT

A magnetic sensor is disclosed having a shallow contiguous junction. Such a sensor is can greatly increase yield for mass-produced heads, especially for large wafers. The magnetic bias layers can be aligned with a free layer of the sensor, improving performance. Milling may be terminated prior to penetration of an antiferromagnetic layer, so that for example the antiferromagnetic layer may extend significantly beyond the free and pinned layers of the sensor.

38 Claims, 5 Drawing Sheets

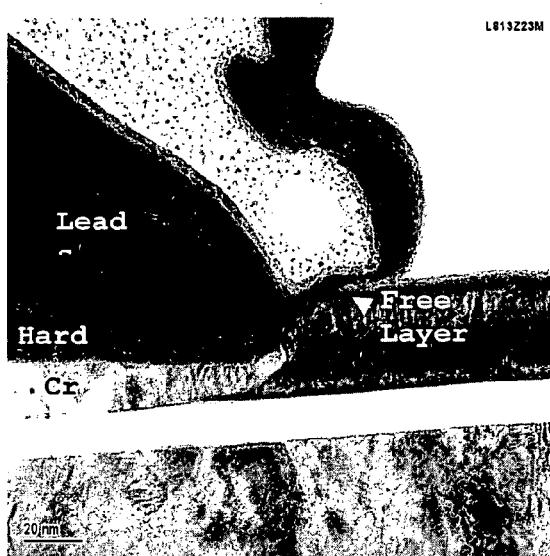
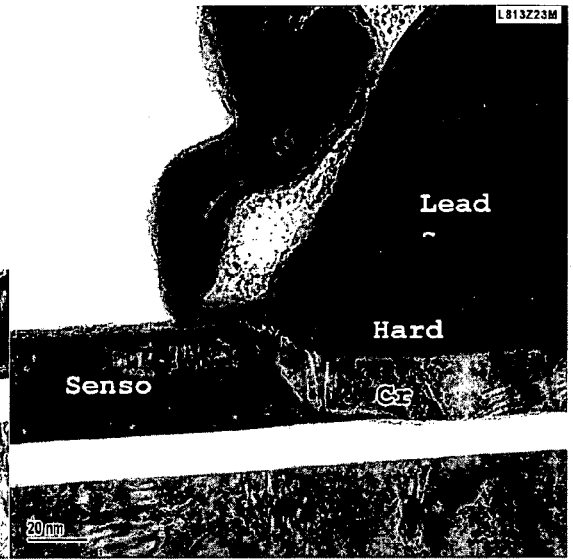
FIG. 6A  FIG. 6B
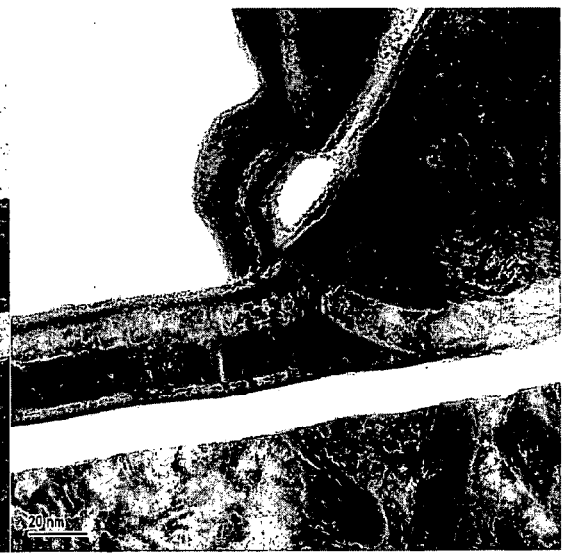
FIG. 7A  FIG. 7B

GMR SENSOR WITH SHALLOW CONTIGUOUS JUNCTION AND BIAS LAYERS ALIGNED WITH FREE SENSOR LAYERS

CROSS-REFERENCE TO RELATED APPLICATIONS

The present application claims the benefit under 35 U.S.C. §119 of Provisional Patent Application Ser. No. 60/459,715 filed Apr. 2, 2003, which is incorporated by reference herein.

TECHNICAL FIELD

The present invention relates to electromagnetic transducers and magnetoresistive sensors. For example such sensors may be employed in a magnetic head for a disk drive.

BACKGROUND

The employment of magnetoresistive (MR) sensors for reading signals from media is well known. Such sensors read signals from the media by detecting a change in resistance of the sensor due to magnetic fields from the media. Many variations of MR sensors are known, such as anisotropic magnetoresistive (AMR) sensors, dual stripe magnetoresistive (DSMR) sensors, giant magnetoresistive (GMR) sensors, spin valve (SV) sensors, spin-dependent tunneling (SDT) sensors and dual spin valve (DSV) sensors.

Common to these sensors is the need to provide bias fields, both to eliminate noise and to facilitate signal readout. A known means for biasing the sensor involves abutting a permanent magnet to ends of the sensor, the magnet preferably forming a contiguous junction across plural sensor layers. Conductive leads, which may be separate from the biasing means, may also adjoin sensor layers along a contiguous junction.

In order to form a contiguous junction, a sensor is usually deposited in layers and then its border defined by masking and ion beam milling or etching (IBE), reactive ion etching (RIE) or the like. As noted in U.S. Pat. No. 6,198,608, ideally milling could be performed that directs an ion beam exactly perpendicular to the surface on which the MR sensors are being formed, resulting in blunt sensor ends that terminate at a ninety-degree angle to that surface.

The prior art notes some problems that would have been expected to increase as the junction angle becomes shallower. U.S. Pat. No. 6,198,608 states that a shallow slope would be expected to create inaccuracy in the width of the sensor, which ideally should match the width of magnetic tracks on the media, called the "track-width." A shallow slope may also increase the length of the contiguous junction regions on both ends of the sensor to be comparable to or even greater than the width of the sensor between the contiguous junction regions, blurring images and causing off-track errors. A shallower angle of the border defining the contiguous junction might also denigrate the bias field provided to the sensor and complicate the sensor domain structures, so that noise would be increased. Overmilling of the sensor layers into an insulating read gap layer is a conventional approach to increasing the slope of the contiguous junction.

SUMMARY

A magnetic sensor is disclosed, comprising an antiferromagnetic layer extending a first distance in a track-width direction; a ferromagnetic pinned layer disposed over the antiferromagnetic layer; a ferromagnetic free layer disposed over the pinned ferromagnetic layer, the free layer having a magnetization that rotates due to an applied magnetic field, the free layer extending a second distance between two ends in the track-width direction, the second distance being not more than half the first distance; a pair of magnetically hard bias layers, each bias layer disposed adjacent to a different one of the ends and providing a magnetic field to stabilize the magnetization of the adjacent end; and a pair of underlayers, each underlayer disposed adjacent to a different one of the hard bias layers to increase alignment between the adjacent bias layer and the free layer.

Such a sensor is can greatly increase yield for mass-produced heads, especially for large wafers. The magnetic bias layers can be aligned with a free layer of the sensor, improving performance. Milling may be terminated prior to penetration of an antiferromagnetic layer, so that for example the antiferromagnetic layer may extend significantly beyond the free and pinned layers of the sensor.

DESCRIPTION OF THE FIGURES

FIG. 6A and FIG. 6B are transmission electron microscopy (TEM) images of a conventional GMR device located near an edge of a six-inch (approximately fifteen-centimeter) wafer.

FIG. 7A and FIG. 7B are TEM images of a GMR device in accordance with one embodiment located near an edge of a six-inch (approximately fifteen-centimeter) wafer.

PREFERRED EMBODIMENTS

Figure 1:
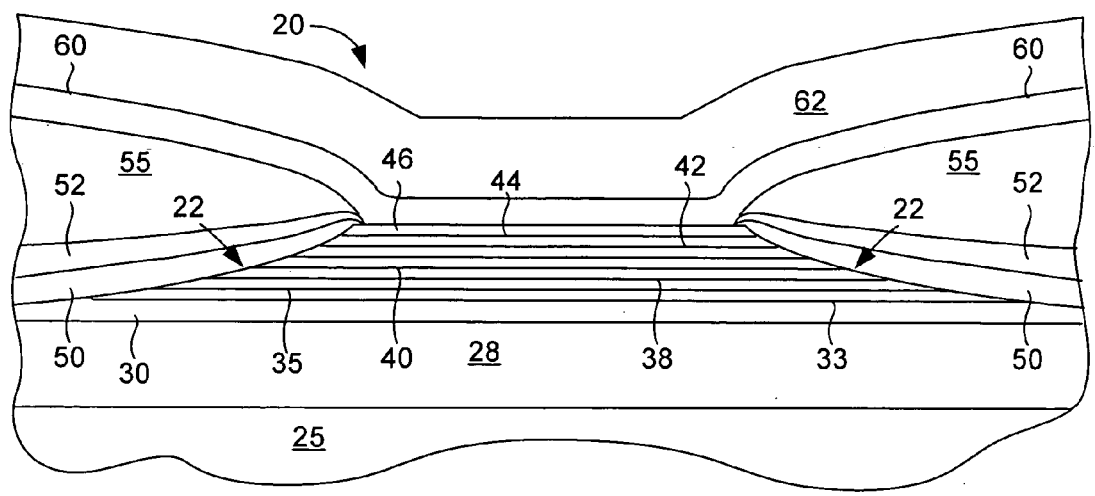
FIG. 1 is a cutaway cross-sectional view of a magnetoresistive (MR) sensor having a shallow contiguous junction with a bias layer substantially aligned with a free layer.

FIG. 1 shows a GMR sensor 20 with a shallow contiguous junction (CJ) 22 disposed between the sensor and material that provides electrical current and magnetic bias fields to the sensor. The view in FIG. 1 is one that would be seen from a medium facing the sensor and looking through a thin diamond coating of the sensor. The sensor 20 has been formed on a major surface of a semiconducting, insulating or ceramic substrate 25 such as a silicon, alumina or alumina-titanium-carbide wafer such that the junction 22 forms an acute angle with the surface of between about forty-five degrees and about ten degrees.

Atop the substrate 25 a first shield layer 28 of magnetically soft material, such as NiFe, has been formed. A submicron read gap layer 30 of electrically insulating, non-magnetic material has been formed, with a number of thinner layers formed atop the read gap 30. The layers include an antiferromagnetic (AF) layer 33, a first pinned ferromagnetic layer 35, a noble metal layer such as ruthenium 38, a second pinned ferromagnetic layer 40, a non-magnetic, electrically conducting spacer layer 42 such as copper or gold, a free ferromagnetic layer 44, and a protective cap layer 46. The AF layer 33 may extend at least twice as far as the free layer 44 in the track-width direction. After these layers have been deposited by physical vapor deposition (PVD) such as sputtering, a plural layer lift-off mask, not shown in this figure, was patterned atop the sensor layers. The sensor layers were then milled by rotating IBE to form the sensor edges of the shallow CJ 22.

One way to create a shallow junction is to perform rotating IBE at an angle to normal with the wafer surface. The junction angle can also be tailored to be steeper adjacent to the free layer 44 and shallower adjacent to the AF layer 33, for example by increasing the angle of the wafer as it rotates.

Because the ion milling process terminates before milling much of the read gap layer 30 to create the shallow CJ 22, the read gap layer 30 can be made thinner than is conventional, for example fifty nanometers or less. This thinner read gap layer 30 in turn increases the resolution of the sensor 22, by decreasing the shield-to-shield spacing.

Electrically conductive, non-magnetic underlayers 50 were then formed of chromium (Cr), tungsten (W) or other materials on the sensor edges of the shallow CJ 22. The underlayers 50 may each be formed of plural layers, for example amorphous layers including of, for example, elements such as gallium or alloys such as nickel-niobium that provide isolation from the crystalline structure of the AF layer, followed by crystalline layers made of, for example, chromium or tungsten alloys that provide crystal lattices promoting in-plane magnetization of adjoining hard bias layers 52. Permanent magnet hard bias layers 52 were then formed on the underlayers 50 so that the bias layers are generally aligned with the free layer 44. The magnetic remanence and thickness product (Mrt) of the bias layers 52, along with the magnetic spacing between the bias layers 52 and the free layer 44 due to the underlayers 52, are selected to provide appropriate bias fields for the free layer 44. For example, a longitudinal magnetic field of about 2000 Oe may be desired at the ends of the free layer, which can stabilize those ends but allow the magnetization of a middle portion of the free layer to rotate in response to an applied field.

The combination of a relatively shallow junction 22 angle and relatively thick underlayers 50 allows the bias layers 52 to be aligned with the free layer 44, improving performance. For example, the underlayers 50 may be about as thick as bias layers 52 that are formed of materials such as cobalt-chrome-platinum (CoCrPt), and the junctions 22 may each be at an angle of less than forty-five degrees, for example between about twenty degrees and about forty degrees from the wafer surface, measured at an end of the free layer. Since the free layer 44 may be difficult to locate although the junction 22 is evident, the junction angle at the free layer may be approximated by measuring about seven nanometers beneath the top of protective cap layer 46. In accordance with one embodiment, the tangent or slope of the junction 22 at the free layer 44 (about seven nanometers below the top of the protective cap) should be less than forty-five degrees.

Electrically conductive leads 55 were then formed out of gold (Au), copper (Cu), aluminum (Al) or other materials. A second read gap layer 60 was then formed of electrically insulating, non-magnetic material, followed by a second soft magnetic shield layer 62.

As sensor track-width and bias layer dimensions are reduced disproportionately compared to the thickness of the sensing layers, such as the pinned and free layers, simply scaling all sensor dimensions does not work and alignment can be problematic. For example, as the thickness of the hard bias layers are reduced to provide lower Mrt, alignment of the hard bias layer and the free layer becomes increasingly difficult. Providing a shallow slope CJ that has been formed by removing less material than is conventional can help with that alignment.

Improved performance and yield may be attained for a sensor 20 in which the combined thickness of the underlayer 50 and bias layer 52 is greater than 75% of the thickness of the sensor layers that are removed by ion milling. For example, if 40 nm of the sensor layers have been removed by IBE, the combined thickness of the underlayer 50 and bias layer 52 may be at least 30 nm. Based on these parameters, the underlayer 50 thickness may be deduced along with the optimal Mrt of the bias layer 52. For example, if the bias layer 52 thickness is 15 nm, the underlayer 50 thickness may be 15 nm. In general, the underlayer thickness is at least eighty-percent of the thickness of the adjoining portion of the bias layer. In one embodiment, the underlayer 50 thickness is 165 Å and the bias layer 52 thickness is 180 Å.

Figure 2:
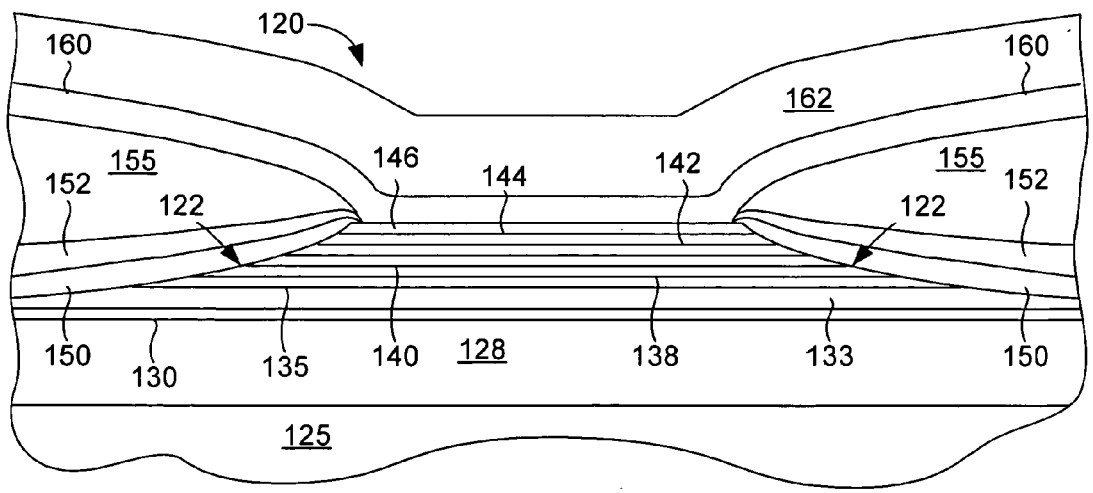
FIG. 2 is a cutaway cross-sectional view of a MR sensor having a shallow contiguous junction with a bias layer substantially aligned with a free layer and a first read gap layer that has not been touched by ion milling.

FIG. 2 shows a GMR sensor 120 with a shallow CJ 122 disposed between the sensor and material that provides electrical current and magnetic bias fields to the sensor. In this embodiment the ion milling that defined the CJ 122 was terminated prior to penetrating most if not all of an AF layer 133, so the AF layer extends substantially further than the other sensor layers in a track-width direction that is parallel to the wafer surface. For example, the AF layer 133 may extend at least ten times as far as the free layer 144 in the track-width direction.

Much as described above, the sensor 120 has been formed on a major surface of a wafer substrate 125 such that the CJ 122 forms an acute angle with the surface of between about 35 degrees and about 10 degrees. Atop the substrate 125 a first shield layer 128 of magnetically soft material, such as NiFe, has been formed. A submicron read gap layer has been formed, on which an AF layer 133, a first pinned ferromagnetic layer 135, a noble metal layer 138, a second pinned ferromagnetic layer 140, a non-magnetic, electrically conducting spacer layer 142, a free ferromagnetic layer 144, and a protective cap layer 146 have been formed.

Because the ion milling process may terminate before milling any of the read gap layer 130 to create the shallow CJ 122, the read gap layer 130 can be made thinner than is conventional, for example ten nanometers or less. This thinner read gap layer 130 in turn increases the resolution of the sensor 122, by decreasing the shield-to-shield spacing.

Electrically conductive, non-magnetic underlayers 150 were then formed of chromium (Cr), tungsten (W) or other materials on the sensor edges of the shallow CJ 122. The underlayers 150 may each be formed of plural layers, for example amorphous layers including, for example, elements such as gallium or alloys such as nickel-niobium that provide isolation from the crystalline structure of the AF layer, followed by crystalline layers made of, for example, chromium or tungsten alloys that provide crystal lattices promoting in-plane magnetization of adjoining hard bias layers 152. Permanent magnet hard bias layers 152 were then formed, for example of a cobalt alloy such as cobalt-platinum (CoPt) on the underlayers 150 so that the bias layers are substantially aligned with the free layer 144. The magnetic remanence and thickness product (Mrt) of the bias layers 152, along with the magnetic spacing between the bias layers 152 and the free layer 144 due to the underlayers 152, are selected to provide appropriate bias fields for the free layer 144.

The combination of a relatively shallow junction 122 angle and relatively thick underlayers 150 allows the bias layers 152 to be aligned with the free layer 144, improving performance. For example, the underlayers 150 may be about as thick as bias layers 152 that are formed of materials such as cobalt-chrome-platinum (CoCrPt), and the junctions 122 may each be at an angle of about 20 degrees to 40 degrees from the wafer surface.

Electrically conductive leads 155 were then formed out of gold (Au), copper (Cu), aluminum (Al) or other materials. A second read gap layer 160 was then formed of electrically insulating, non-magnetic material, followed by a second soft magnetic shield layer 162.

The magnetizations of the bias layers 152 are geometrically favored in longitudinal directions that are parallel to the layers 152. For a conventional CJ having a relatively steep slope, field lines that are directed outward from an end of a bias layer in the longitudinal direction of that layer may curve to be directed perpendicular to the plane of the free layer, so that the effectiveness of the bias layers in pinning the edges of the free layer is reduced.

Improved performance and yield may be attained for a sensor 120 in which the combined thickness of the underlayer 150 and bias layer 152 is greater than 75% of the thickness of the sensor layers that are removed by ion milling. For example, if 40 nm of the sensor layers have been removed by IBE, the combined thickness of the underlayer 150 and bias layer 152 may be at least 30 nm. Based on these parameters, the underlayer 150 thickness may be deduced along with the optimal Mrt of the bias layer 152. For example, if the bias layer 152 thickness is 15 nm, the underlayer 150 thickness may be 15 nm.

Figure 3:
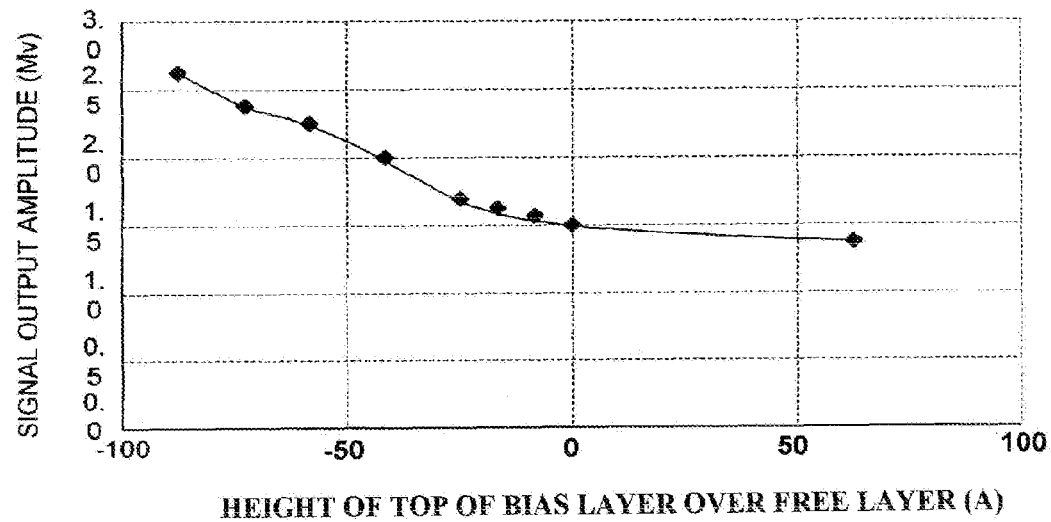
FIG. 3 is a plot of signal amplitude of a bottom spin valve sensor versus the height of the top of the bias layer over the free layer.

FIG. 3 is a plot of signal amplitude of a GMR sensor that has a free layer formed over a pinned layer, also called a bottom spin valve, compared with a height of a top of the bias layer over the free layer. The signal amplitude can be seen to decrease as location of the top of the bias layer is changed from beneath the free layer to aligned with the free layer. Further gradual decrease in signal amplitude is evident as the top of the bias layer moves to a location above the free layer. The reduction in signal amplitude, while generally undesirable from a sensitivity standpoint, may indicate that the free layer is better pinned by the bias layer, implying a reduction in noise.

Figure 4:
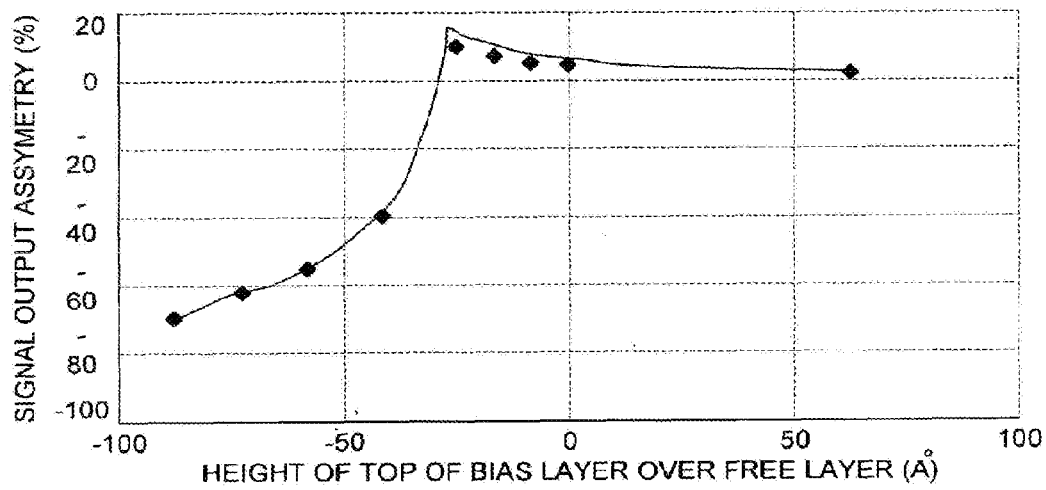
FIG. 4 is a plot of signal asymmetry of a bottom spin valve sensor versus the height of the top of the bias layer over the free layer.

FIG. 4 is a plot of signal output asymmetry versus the height of the top of the bias layer over the free layer. A height of the bias layer top that is more than 20 nm below the free layer can be seen to result in poor asymmetry. Asymmetry is reduced as the top of the bias layer is aligned with or disposed above the free layer.

Figure 5:
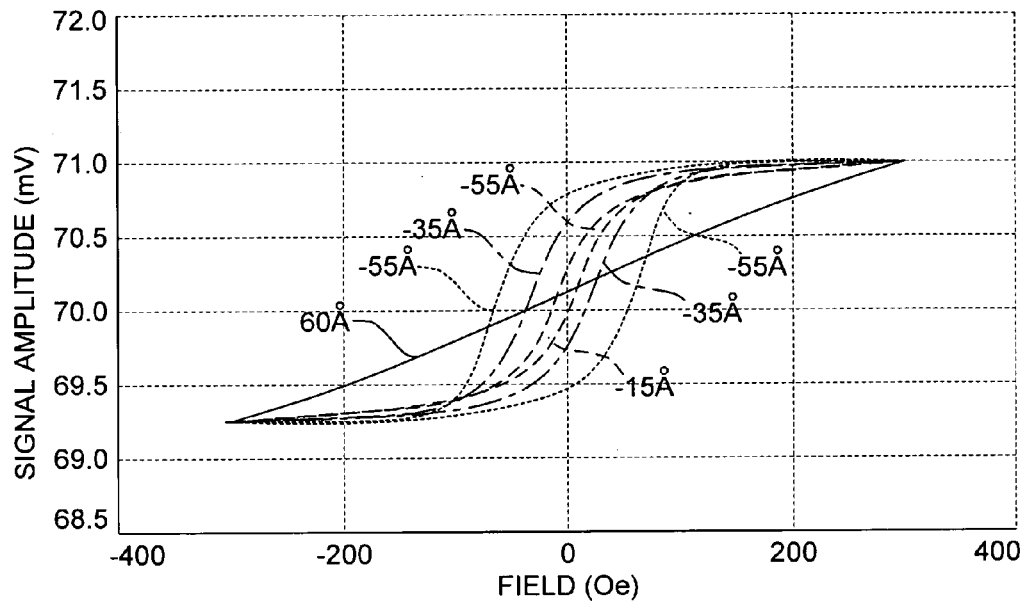
FIG. 5 is a plot of signal amplitude hysteresis for a bottom spin valve sensor versus the height of the top of the bias layer over the free layer.

FIG. 5 is a plot of signal output versus applied field, for bottom spin valve sensors having different relative heights of the bias layers compared with the free layer. For a sensor with a bias layer top that is 60 Å above the free layer, little hysteresis is evident. As the top of the sensors relative to the bias layer becomes more negative, −15 Å to −35 Å to −55 Å, hysteresis becomes more evident. This plot also implies that sensor performance improves as the relative bias layer height increases to be approximately aligned with the free layer.

In addition to improved performance, the yield of mass produced sensors has dramatically increased when the sensors are fabricated to have a shallow slope CJ and bias layers that are approximately aligned with the free layer. This increase in yield, which is the percentage of sensors formed on a wafer which meet functional parameters, may be due to a combination of the angular dispersion of deposition material from a sputtering target, shadowing effects during deposition of the bias and lead layers, and the differing angle of incident deposition materials compared to different portions of a wafer surface. This increase in yield may be an order of magnitude for sensors created on larger wafers (e.g., six inch diameter), for which the angle between the target and the wafer surface varies more for inner versus outer portions of the wafer. During fabrication most sensors are located near the periphery of a circular wafer, so that inadequate deposition due to sputtering target angle may affect yield in proportion to a square of the increase in the wafer radius, becoming much more problematic for larger wafers.

FIG. 6A and FIG. 6B show transmission electron microscopy (TEM) images of a GMR device located near an edge of a six-inch (approximately fifteen-centimeter) wafer with a conventional CJ structure. As seen in the images, the hard bias and lead structures have a different geometry and proportions for one side of the device, shown in FIG. 6A, compared to the other side of the device, shown in FIG. 6B. In this example, the hard bias seems to be well aligned with the free layer at one side of the junction as seen in FIG. 6B, however, hard bias is disposed below the level of free layer on the other side, as shown in FIG. 6A. The disadvantageous geometry of FIG. 6A may be related to a shadow of a photoresist mask during rotating ion beam deposition of the underlayer and hard bias layers, especially due to an angular dispersion of deposition material from the target that provides the material. Such a shadow effect may cause one side of a CJ junction (outboard) to experience more severe shadowing, and consequently poor coverage of underlayer and hard bias layer on the junction slope. There can be a significant performance impact caused by such a misalignment of hard bias layers, as discussed above.

TEM images of CJ junctions in accordance with one embodiment are shown in FIG. 7A and FIG. 7B. It can be seen that the device at the same location of the wafer has much improved alignment between hard bias and sensor free layer. It is also observed that the junction angle is shallower (approximately forty degrees), compared to that seen in FIG. 1 (approximately sixty degrees). In addition, the Cr underlayer coverage on the junction is much improved, as evidenced by the increased thickness on the junction slope. With a thicker underlayer separating hard bias to the edge of free layer, a slightly thicker hard bias layer is needed to provide the same magnetostatic bias field for the free layer.

The thicker underlayer and thicker hard bias layer further improve the alignment between hard bias and free layer.

In order to ensure proper alignment between the bias layer and the free layer, even for the devices located at the extreme edges on the wafer, distances between the top point of the bias layer and the top surface of the GMR sensor have been experimentally measured from TEMs. The bias layer angle for this experiment was held at a shallow angle of approximately forty degrees by fixing the milling conditions. The free layer was located about seven nm below the surface of GMR sensor. The total thickness of the Cr underlayer and the hard bias layer was varied between twenty-two nm and forty nm. From this experiment it was found that a minimum total thickness of about thirty nm may help to ensure alignment between the free layer and the bias layer across the wafer. The minimum required underlayer thickness may be determined based on the required hard bias thickness to provide sufficient bias with a given hard bias materials system. For devices with a track-width of less than two hundred nm, an underlayer thickness of at least about twenty nm has been found to provide many advantages.

Figure 8:
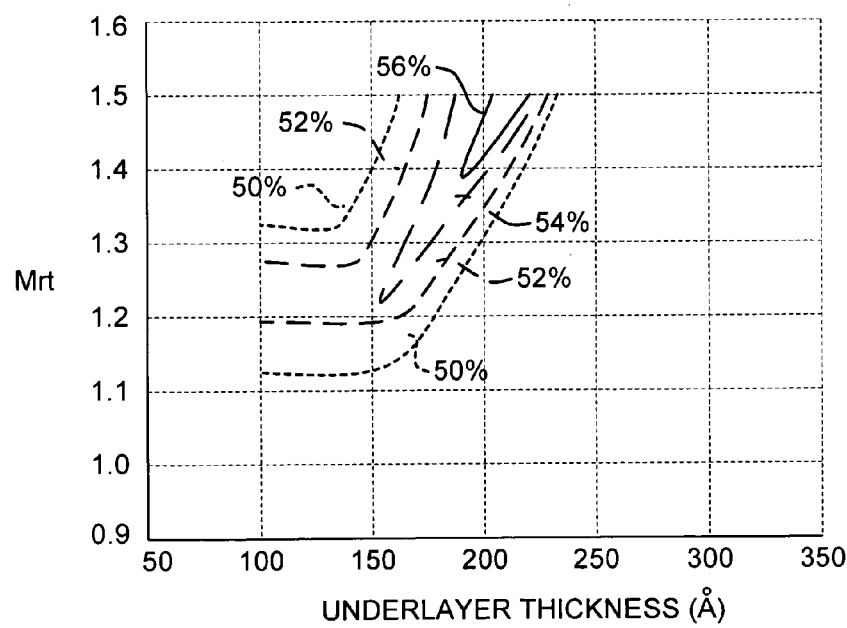
FIG. 8 is a plot of overall device performance yield as a function of underlayer thickness and bias layer Mrt (remanence moment and thickness product).

The overall device performance yield is plotted in FIG. 8, as a function of Cr underlayer thickness and bias layer Mrt (remanence moment and thickness product). The yield, which is a measure of the percentage of devices on a wafer that are fully performing, can be seen to increase with underlayer thickness that is greater than about 170 angstroms and Mrt that is greater than about 1.4. It has been observed the optimum yield is only achieved beyond a minimum required Cr thickness and Mrt regime. The design point for both underlayer and hard bias is at relatively larger thickness for both, which also has beneficial effects for thermal stability of hard bias layer magnetic properties.

Figure 9:
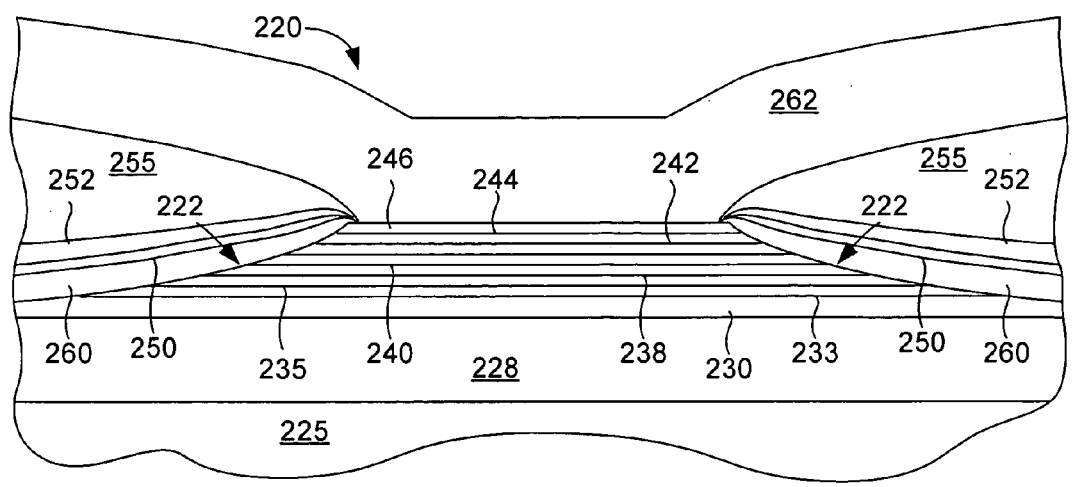
FIG. 9 is a cutaway cross-sectional view of a current perpendicular to plane (CPP) sensor having a shallow contiguous junction with a bias layer substantially aligned with a free layer.

FIG. 9 shows a current perpendicular to plane (CPP) sensor 220 with a shallow contiguous junction (CJ) 222 disposed between the sensor and material that provides magnetic bias fields to the sensor. The view in FIG. 9 is one that would be seen from a medium facing the sensor and looking through a thin diamond coating of the sensor. The sensor 220 has been formed on a major surface of a semiconducting, insulating or ceramic substrate 225 such as a silicon, alumina or alumina-titanium-carbide wafer such that the junction 222 forms an acute angle with the surface of between about forty-five degrees and about ten degrees. Atop the substrate 225 a first shield layer 228 of magnetically soft material, such as NiFe, has been formed. In this embodiment the first shield layer 228 also serves as an electrical lead that provides current to the sensor, with the current traversing a plurality of sensor layers between the first shield layer 228 and a second shield layer 262. An electrically conductive lead layer 230 has been formed for example of tantalum (Ta), tantalum-nickel-iron (Ta), nickel-chromium (NiCr) or nickel-iron-chromium (NiFeCr) atop the first shield layer 228. The sensor layers include an electrically conductive AF layer 233, a first pinned ferromagnetic layer 235, a noble metal layer such as ruthenium 238, a second pinned ferromagnetic layer 240, a non-magnetic spacer layer 242, a free ferromagnetic layer 244, and a protective cap layer 246. The non-magnetic spacer layer 242 may be made of electrically insulating material such as alumina, silicon-dioxide or aluminum-nitride or electrically conductive material such as copper (Cu), aluminum-copper (AlCu) or copper/copper oxide (Cu/CuO), may include magnetic particles or elements in alloys, and may be made of plural layers.

After the sensor layers have been deposited by physical vapor deposition (PVD) such as sputtering, a plural layer lift-off mask, not shown in this figure, was patterned atop the sensor layers. The sensor layers were then trimmed by rotating IBE to form the sensor edges of the shallow CJ 222. Amorphous, electrically insulating underlayers 260 were formed over the first shield 228 and shallow CJ 222. Crystalline underlayers 250 were then formed of chromium (Cr), tungsten (W), nickel-aluminum (NiAl) or other materials on the sensor edges of the shallow CJ 222. Permanent magnet hard bias layers 252 were then formed on the underlayers 250 so that the bias layers are aligned with the free layer 244. The magnetic remanence and thickness product (Mrt) of the bias layers 252, along with the magnetic spacing between the bias layers 252 and the free layer 244 due to the underlayers 260 and 250, are selected to provide appropriate bias fields for the free layer 244. The combination of a relatively shallow junction 222 angle and relatively thick underlayers 260 and 250 allows the bias layers 252 to be aligned with the free layer 244, improving performance. For example, the combined thickness of underlayers 260 and 250 may be about equal to the thickness of bias layers 252 that are formed of materials such as cobalt-chrome-platinum (CoCrPt), and the junctions 22 may each be at an angle of about 20 degrees –40 degrees from the wafer surface. Another aspect of this embodiment that is evident in FIG. 9 is that the AF layer 233 may extend in the track-width direction more than fifty percent more than the free layer 244 extends in the track-width direction. Similarly, the AF layer 233 may extend beyond the free layer 244 in the track-width direction an amount that is greater than the combined thickness of a stack of contiguous sensor layers that includes the AF layer 233 and the free layer 244.

Electrically insulating layers 255 were then formed out of alumina, silicon dioxide or other materials, followed by a second soft magnetic shield layer 262.

Figure 10:
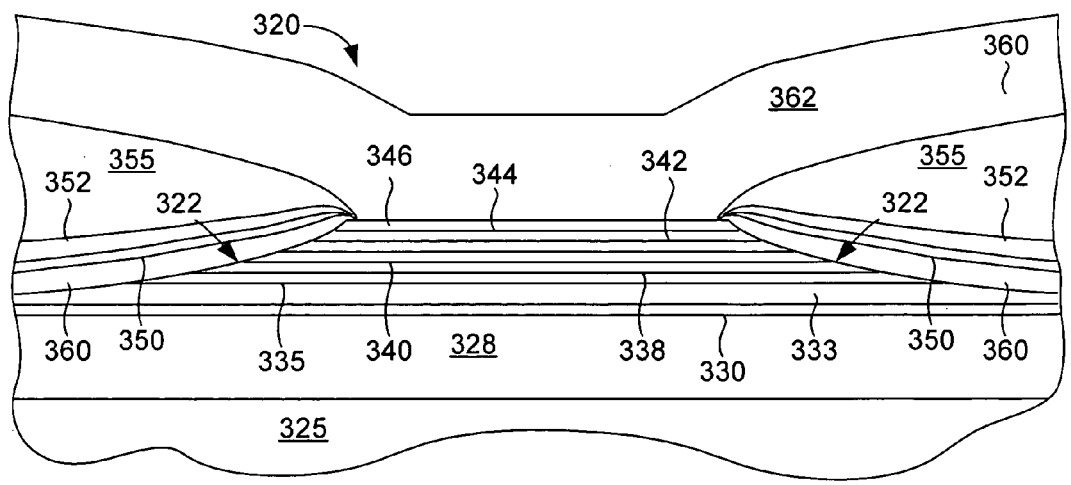
FIG. 10 is a cutaway cross-sectional view of a CPP sensor having a shallow contiguous junction with a bias layer substantially aligned with a free layer and a first read gap layer that has not been touched by ion milling.

FIG. 10 shows a CPP sensor 320 with a shallow CJ 322 disposed between the sensor and material that provides magnetic bias fields to the sensor. In this embodiment the ion milling that defined the CJ 322 was terminated prior to penetrating most if not all of an AF layer 333, so the AF layer extends substantially further than the other sensor layers in a track-width direction that is parallel to the wafer surface.

Much as described above, the sensor 320 has been formed on a major surface of a wafer substrate 325 such that the CJ 322 as measured along edges of the free and pinned layers forms an acute angle with the surface of less than forty-five degrees, for example between about thirty-five degrees and about ten degrees. Atop the substrate 325 a first shield layer 328 of magnetically soft material, such as NiFe, has been formed. An electrically conductive lead layer 330 has been formed for example of tantalum (Ta), tantalum-nickel-iron (Ta), nickel-chromium (NiCr) or nickel-iron-chromium (NiFeCr) atop the first shield layer 328. An AF layer 333, a first pinned ferromagnetic layer 335, a noble metal layer 338, a second pinned ferromagnetic layer 340, a non-magnetic, electrically insulating or resistive spacer layer 342, a free ferromagnetic layer 344, and a protective cap layer 346 have been formed.

Amorphous, electrically insulating underlayers 360 were formed over the first shield 328 and shallow CJ 322. Crystalline underlayers 350 were then formed of chromium (Cr), tungsten (W) or other materials on the sensor edges of the shallow CJ 322. Permanent magnet hard bias layers 352 were then formed on the underlayers 350 so that the bias layers are substantially aligned with the free layer 344. The combination of a relatively shallow junction 322 angle and relatively thick underlayers 360 and 350 allows the bias layers 352 to be aligned with the free layer 344, improving performance. For example, the underlayers 330 and 350 may be about as thick as bias layers 352 that are formed of materials such as cobalt-chrome-platinum (CoCrPt), and the junctions 322 may each be at an angle of less than forty-five degrees, for example between about twenty degrees and about forty degrees from the wafer surface. Electrically insulating, non-magnetic layers 355 were then formed, followed by a second soft magnetic shield layer 362.

The magnetizations of the bias layers 352 are geometrically favored in longitudinal directions that are parallel to the layers 352. The crystalline underlayers 350 may also encourage in-plane magnetization. For a conventional CJ having a relatively steep slope, field lines that are directed outward from an end of a bias layer in the longitudinal direction of that layer may curve to be directed perpendicular to the plane of the free layer, so that an out-of plane magnetization of the bias layers may be preferred.

Improved performance and yield may be attained for a sensor 320 in which the combined thickness of the underlayers 330 and 350 and bias layer 352 is greater than 75% of the thickness of the sensor layers that are removed by ion milling. For example, if 40 nm of the sensor layers have been removed by IBE, the combined thickness of the underlayer 350 and bias layer 352 may be at least 30 nm. Based on these parameters, the combined thickness of the underlayers 330 and 350 may be deduced along with the optimal Mrt of the bias layer 352. For example, if the bias layer 352 thickness is 15 nm, the combined thickness of underlayers 330 and 350 may be 15 nm.

The invention claimed is:

1. A magnetic sensor comprising:
an antiferromagnetic layer extending in a track-width direction;
a ferromagnetic layer disposed over the antiferromagnetic layer, the ferromagnetic layer having a magnetization that remains substantially fixed in response to an applied magnetic field and extending in the track-width direction to terminate in a first end;
a magnetically soft layer disposed over the ferromagnetic layer, the magnetically soft layer having a magnetization that rotates in response to the applied magnetic field, the magnetically soft layer extending in the track-width direction to terminate in a second end, the first and second ends forming part of a junction;
a cap layer disposed over the magnetically soft layer such that the junction has a slope of less than forty-five degrees when measured at a location seven nanometers below a top of the cap layer;
a magnetically hard layer disposed adjacent to at least the second end, the magnetically hard layer having a magnetization that remains substantially fixed in response to the applied magnetic field, to stabilize the magnetization of the end of the magnetically soft layer; and
an underlayer disposed between the antiferromagnetic layer and the magnetically hard layer
wherein the magnetic sensor has at least one set of characteristics selected from a group consisting of the following sets of characteristics:
(a) an electrically conductive, nonmagnetic layer disposed between the ferromagnetic layer and the magnetically soft layer;
(b) a first magnetically soft shield, and a first electrically insulating read gap layer adjoining the first magnetically soft shield and the antiferromagnetic layer, wherein the first electrically insulating read gap layer has a first uniform thickness; and
(c) a second magnetically soft shield, and a second electrically insulating read gap layer adjoining the second magnetically soft shield and the antiferromagnetic layer, wherein the second electrically insulating read gap layer has a second uniform thickness of about fifty nanometers or less.

2. The sensor of claim 1, wherein the underlayer has a thickness that is at least eighty-percent as large as the thickness of the adjacent magnetically hard layer.

3. The sensor of claim 1, wherein the underlayer has a thickness that is at least as large as the thickness of the adjacent magnetically hard layer.

4. The sensor of claim 1, wherein the underlayer includes an amorphous layer and a crystalline layer.

5. The sensor of claim 1, wherein the underlayer includes an electrically conductive amorphous layer and a crystalline layer.

6. The sensor of claim 1, wherein the underlayer includes an electrically insulating amorphous layer and a crystalline layer.

7. The sensor of claim 1, wherein the underlayer and magnetically hard layer have a combined thickness that is at least about three-quarters the height of the junction.

8. The sensor of claim 1, wherein the sensor further includes the electrically conductive, nonmagnetic layer disposed between the ferromagnetic layer and the magnetically soft layer.

9. A magnetic sensor comprising:
an antiferromagnetic layer extending in a track-width direction;
a ferromagnetic layer disposed over the antiferromagnetic layer, the ferromagnetic layer having a magnetization that remains substantially fixed in response to an applied magnetic field and extending in the track-width direction to terminate in a first end;
a magnetically soft layer disposed over the ferromagnetic layer, the magnetically soft layer having a magnetization that rotates in response to the applied magnetic field, the magnetically soft layer extending in the track-width direction to terminate in a second end, the first and second ends forming part of a junction;
a cap layer disposed over the magnetically soft layer such that the junction has a slope of less than forty-five degrees when measured at a location seven nanometers below a top of the cap layer;
a magnetically hard layer disposed adjacent to at least the second end, the magnetically hard layer having a magnetization that remains substantially fixed in response to the applied magnetic field, to stabilize the magnetization of the end of the magnetically soft layer;
an underlayer disposed between the antiferromagnetic layer and the magnetically hard layer; and
a dielectric layer disposed between the ferromagnetic layer and the magnetically soft layer.

10. A magnetic sensor comprising:
an antiferromagnetic layer extending in a track-width direction;
a ferromagnetic layer disposed over the antiferromagnetic layer, the ferromagnetic layer having a magnetization that remains substantially fixed in response to an applied magnetic field and extending in the track-width direction to terminate in a first end;
a magnetically soft layer disposed over the ferromagnetic layer, the magnetically soft layer having a magnetization that rotates in response to the applied magnetic field, the magnetically soft layer extending in the track-width direction to terminate in a second end, the first and second ends forming part of a junction;
a cap layer disposed over the magnetically soft layer such that the junction has a slope of less than forty-five degrees when measured at a location seven nanometers below a top of the cap layer;

a magnetically hard layer disposed adjacent to at least the second end, the magnetically hard layer having a magnetization that remains substantially fixed in response to the applied magnetic field, to stabilize the magnetization of the end of the magnetically soft layer;

an underlayer disposed between the antiferromagnetic layer and the magnetically hard layer; and a resistive layer disposed between the ferromagnetic layer and the magnetically soft layer.

11. The sensor of claim 1, wherein the sensor further includes the first magnetically soft shield, and the first electrically insulating read gap layer adjoining the first magnetically soft shield and the antiferromagnetic layer, wherein the first electrically insulating read gap layer has the uniform thickness.

12. The sensor of claim 11, wherein the read gap layer thickness is about fifty nanometers or less.

13. A magnetic sensor comprising:
an antiferromagnetic layer extending a first distance in a track-width direction;
a ferromagnetic layer disposed over the antiferromagnetic layer, the ferromagnetic layer having a magnetization that remains substantially fixed in response to an applied magnetic field;
a magnetically soft layer disposed over the ferromagnetic layer, the magnetically soft layer having a magnetization that rotates in response to the applied magnetic field, the magnetically soft layer extending a second distance in the track-width direction, the second distance being not more than half the first distance;
a magnetically hard layer disposed adjacent to an end of the magnetically soft layer, the magnetically hard layer having a magnetization that remains substantially fixed in response to the applied magnetic field, to stabilize the magnetization of the end of the magnetically soft layer; and
an underlayer disposed between the antiferromagnetic layer and the magnetically hard layer;
wherein the magnetic sensor has at least one set of characteristics selected from a group consisting of the following sets of characteristics:
(a) an electrically conductive, nonmagnetic layer disposed between the ferromagnetic layer and the magnetically soft layer;
(b) a first magnetically soft shield, and a first electrically insulating read gap layer adjoining the first magnetically soft shield and the antiferromagnetic layer, wherein the first electrically insulating read gap layer has a first uniform thickness; and
(c) a second magnetically soft shield, and a second electrically insulating read gap layer adjoining the second magnetically soft shield and the antiferromagnetic layer, wherein the second electrically insulating read gap layer has a second uniform thickness of about fifty nanometers or less.

14. The sensor of claim 13, wherein the underlayer has a thickness that substantially aligns the magnetically hard layer and the magnetically soft layer.

15. The sensor of claim 13, wherein the underlayer has a thickness that is at least about as large as the thickness of the adjacent magnetically hard layer.

16. The sensor of claim 13, wherein the underlayer includes an amorphous layer and a crystalline layer.

17. The sensor of claim 13, wherein the underlayer includes an electrically conductive amorphous layer and a crystalline layer.

18. The sensor of claim 13, wherein the underlayer includes an electrically insulating amorphous layer and a crystalline layer.

19. The sensor of claim 13, wherein the end forms part of a contiguous junction, and the underlayer and magnetically hard layer have a combined thickness that is at least about three-quarters the height of the contiguous junction.

20. The sensor of claim 13, wherein the sensor further includes the electrically conductive, nonmagnetic layer disposed between the ferromagnetic layer and the magnetically soft layer.

21. The sensor of claim 13, wherein the sensor further includes the first magnetically soft shield, and the first electrically insulating read gap layer adjoining the first magnetically soft shield and the antiferromagnetic layer, wherein the first electrically insulating read gap layer has a uniform thickness.

22. The sensor of claim 21, wherein the first electrically insulating read gap layer thickness is about fifty nanometers or less.

23. A magnetic sensor comprising:
an antiferromagnetic layer extending a first distance in a track-width direction;
a ferromagnetic layer disposed over the antiferromagnetic layer, the ferromagnetic layer having a magnetization that remains substantially fixed in response to an applied magnetic field;
a magnetically soft layer disposed over the ferromagnetic layer, the magnetically soft layer having a magnetization that rotates in response to the applied magnetic field, the magnetically soft layer extending a second distance in the track-width direction, the second distance being not more than half the first distance;
a magnetically hard layer disposed adjacent to an end of the magnetically soft layer, the magnetically hard layer having a magnetization that remains substantially fixed in response to the applied magnetic field, to stabilize the magnetization of the end of the magnetically soft layer; and
an underlayer disposed between the antiferromagnetic layer and the magnetically hard layer; and
a dielectric layer disposed between the ferromagnetic layer and the magnetically soft layer.

24. A magnetic sensor comprising:
an antiferromagnetic layer extending a first distance in a track-width direction;
a ferromagnetic layer disposed over the antiferromagnetic layer, the ferromagnetic layer having a magnetization that remains substantially fixed in response to an applied magnetic field;
a magnetically soft layer disposed over the ferromagnetic layer, the magnetically soft layer having a magnetization that rotates in response to the applied magnetic field, the magnetically soft layer extending a second distance in the track-width direction, the second distance being not more than half the first distance;
a magnetically hard layer disposed adjacent to an end of the magnetically soft layer, the magnetically hard layer having a magnetization that remains substantially fixed in response to the applied magnetic field, to stabilize the magnetization of the end of the magnetically soft layer; and
an underlayer disposed between the antiferromagnetic layer and the magnetically hard layer; and a resistive layer disposed between the ferromagnetic layer and the magnetically soft layer.

25. A magnetic sensor comprising:
an antiferromagnetic layer extending in a track-width direction;
a ferromagnetic layer disposed over the antiferromagnetic layer, the ferromagnetic layer having a magnetization that remains substantially fixed in response to an applied magnetic field and extending in the track-width direction;
a magnetically soft layer disposed over the ferromagnetic layer, the magnetically soft layer having a magnetization that rotates in response to the applied magnetic field, the magnetically soft layer extending in the track-width direction to terminate in an end, such that the antiferromagnetic layer, ferromagnetic layer and magnetically soft layer form a stack having a thickness that is less than an amount that the antiferromagnetic layer extends in the track-width direction beyond the end;
a magnetically hard layer disposed adjacent to the end, the magnetically hard layer having a magnetization that remains substantially fixed in response to the applied magnetic field, to stabilize the magnetization of the end of the magnetically soft layer; and
an underlayer disposed between the antiferromagnetic layer and the magnetically hard layer;
wherein the magnetic sensor has at least one set of characteristics selected from a group consisting of the following sets of characteristics:
(a) an electrically conductive, nonmagnetic layer disposed between the ferromagnetic layer and the magnetically soft layer;
(b) a first magnetically soft shield, and a first electrically insulating read gap layer adjoining the first magnetically soft shield and the antiferromagnetic layer, wherein the first electrically insulating read gap layer has a first uniform thickness; and
(c) a second magnetically soft shield, and a second electrically insulating read gap layer adjoining the second magnetically soft shield and the antiferromagnetic layer, wherein the second electrically insulating read gap layer has a second uniform thickness of about fifty nanometers or less.

26. The sensor of claim 25, wherein the underlayer has a thickness that substantially aligns the magnetically hard layer and the magnetically soft layer.

27. The sensor of claim 25, wherein the underlayer has a thickness that is at least about as large as the thickness of the adjacent magnetically hard layer.

28. The sensor of claim 25, wherein the underlayer includes an amorphous layer and a crystalline layer.

29. The sensor of claim 25, wherein the underlayer includes an electrically conductive amorphous layer and a crystalline layer.

30. The sensor of claim 25, wherein the underlayer includes an electrically insulating amorphous layer and a crystalline layer.

31. The sensor of claim 25, wherein the end forms part of a contiguous junction, and the underlayer and magnetically hard layer have a combined thickness that is at least about three-quarters the height of the contiguous junction.

32. The sensor of claim 25, further comprising an electrically conductive, nonmagnetic layer disposed between the ferromagnetic layer and the magnetically soft layer.

33. The sensor of claim 25, further comprising a magnetically soft shield, and an electrically insulating read gap layer disposed between the magnetically soft shield and the antiferromagnetic layer, wherein the read gap layer has a uniform thickness.

34. The sensor of claim 33, wherein the read gap layer thickness is not more than about fifty nanometers.

35. A magnetic sensor comprising:
an antiferromagnetic layer extending in a track-width direction;
a ferromagnetic layer disposed over the antiferromagnetic layer, the ferromagnetic layer having a magnetization that remains substantially fixed in response to an applied magnetic field and extending in the track-width direction;
a magnetically soft layer disposed over the ferromagnetic layer, the magnetically soft layer having a magnetization that rotates in response to the applied magnetic field, the magnetically soft layer extending in the track-width direction to terminate in an end, such that the antiferromagnetic layer, ferromagnetic layer and magnetically soft layer form a stack having a thickness that is less than an amount that the antiferromagnetic layer extends in the track-width direction beyond the end;
a magnetically hard layer disposed adjacent to the end, the magnetically hard layer having a magnetization that remains substantially fixed in response to the applied magnetic field, to stabilize the magnetization of the end of the magnetically soft layer;
an underlayer disposed between the antiferromagnetic layer and the magnetically hard layer; and
a dielectric layer disposed between the ferromagnetic layer and the magnetically soft layer.

36. A magnetic sensor comprising:
an antiferromagnetic layer extending in a track-width direction;
a ferromagnetic layer disposed over the antiferromagnetic layer, the ferromagnetic layer having a magnetization that remains substantially fixed in response to an applied magnetic field and extending in the track-width direction;
a magnetically soft layer disposed over the ferromagnetic layer, the magnetically soft layer having a magnetization that rotates in response to the applied magnetic field, the magnetically soft layer extending in the track-width direction to terminate in an end, such that the antiferromagnetic layer, ferromagnetic layer and magnetically soft layer form a stack having a thickness that is less than an amount that the antiferromagnetic layer extends in the track-width direction beyond the end;
a magnetically hard layer disposed adjacent to the end, the magnetically hard layer having a magnetization that remains substantially fixed in response to the applied magnetic field, to stabilize the magnetization of the end of the magnetically soft layer;
an underlayer disposed between the antiferromagnetic layer and the magnetically hard layer; and
a resistive layer disposed between the ferromagnetic layer and the magnetically soft layer.

37. A magnetic sensor comprising:
an antiferromagnetic layer extending a first distance in a track-width direction;
a ferromagnetic pinned layer disposed over the antiferromagnetic layer;
a ferromagnetic free layer disposed over the pinned ferromagnetic layer, the free layer having a magnetization that rotates due to an applied magnetic field, the free layer extending a second distance between two ends in the track-width direction, the second distance being not more than half the first distance;

a pair of magnetically hard bias layers, each bias layer disposed adjacent to a different one of the ends and providing a magnetic field to stabilize the magnetization of the adjacent end; and a pair of underlayers, each underlayer disposed adjacent to a different one of the hard bias layers to increase alignment between the adjacent bias layer and the free layer;

wherein the magnetic sensor has at least one set of characteristics selected from a group consisting of the following sets of characteristics:

(a) an electrically conductive, nonmagnetic layer disposed between the ferromagnetic free layer and the ferromagnetic pinned layer;

(b) a first magnetically soft shield, and a first electrically insulating read gap layer adjoining the first magnetically soft shield and the antiferromagnetic layer, wherein the first electrically insulating read gap layer has a first uniform thickness; and (c) a second magnetically soft shield, and a second electrically insulating read gap layer adjoining the second magnetically soft shield and the antiferromagnetic layer, wherein the second electrically insulating read gap layer has a second uniform thickness of about fifty nanometers or less.

38. A magnetic sensor comprising:

an antiferromagnetic layer extending in a track-width direction;

a ferromagnetic layer disposed over the antiferromagnetic layer, the ferromagnetic layer having a magnetization that remains substantially fixed in response to an applied magnetic field and extending in the track-width direction to terminate in a first end;

a magnetically soft layer disposed over the ferromagnetic layer, the magnetically soft layer having a magnetization that rotates in response to the applied magnetic field, the magnetically soft layer extending in the track-width direction to terminate in a second end, the first and second ends forming part of a junction, the junction having a slope of at least twenty and not more than forty degrees at the magnetically soft layer;

a magnetically hard layer disposed adjacent to at least the second end, the magnetically hard layer having a magnetization that remains substantially fixed in response to the applied magnetic field, to stabilize the magnetization of the end of the magnetically soft layer; and an underlayer disposed between the antiferromagnetic layer and the magnetically hard layer;

wherein the magnetic sensor has at least one set of characteristics selected from a group consisting of the following sets of characteristics:

(a) the underlayer has a first thickness that is at least eighty-percent as large as the thickness of the adjacent magnetically hard layer;

(b) the underlayer has a second thickness that is at least as large as the thickness of the adjacent magnetically hard layer;

(c) the underlayer and magnetically hard layer have a combined thickness that is at least about three-quarters the height of the junction; and (d) the underlayer has a fourth thickness that substantially aligns the magnetically hard layer and the magnetically soft layer.

* * * * *